(12) United States Patent
Lau et al.

(10) Patent No.: US 11,044,834 B1
(45) Date of Patent: Jun. 22, 2021

(54) INVERTED LIQUID COOLING SYSTEM

(71) Applicant: Google LLC, Mountain View, CA (US)

(72) Inventors: Michael Chi Kin Lau, San Francisco, CA (US); William F. Edwards, Jr., Livermore, CA (US); Justin S. Lee, Santa Clara, CA (US); Winnie Leung, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/797,450

(22) Filed: Feb. 21, 2020

(51) Int. Cl.
*H05K 7/20* (2006.01)
*H05K 7/14* (2006.01)

(52) U.S. Cl.
CPC ....... *H05K 7/20781* (2013.01); *H05K 7/1489* (2013.01); *H05K 7/20272* (2013.01); *H05K 7/20254* (2013.01)

(58) Field of Classification Search
CPC .......... H05K 7/20709–20836; H05K 7/20272; H05K 7/20254; H05K 1/0201–021; H05K 2201/066
USPC .................................................. 361/699, 702
See application file for complete search history.

(56) References Cited

U.S. PATENT DOCUMENTS

| | | | |
|---|---|---|---|
| 4,698,728 A | 10/1987 | Tustaniwskji et al. | |
| 7,414,845 B2 | 8/2008 | Attlesey et al. | |
| 7,944,694 B2 | 5/2011 | Campbell et al. | |
| 8,467,188 B2 * | 6/2013 | Hsieh | H05K 7/20927 361/698 |
| 9,007,221 B2 | 4/2015 | Azaighami et al. | |
| 9,357,675 B2 | 5/2016 | Campbell et al. | |
| 9,552,025 B2 | 1/2017 | Samadiani et al. | |
| 9,606,588 B2 | 3/2017 | Dean et al. | |
| 10,761,577 B1 * | 9/2020 | Bender | H05K 7/20772 |
| 2008/0276639 A1 | 11/2008 | Stoddard | |
| 2009/0262495 A1 | 10/2009 | Neudorfer | |

(Continued)

FOREIGN PATENT DOCUMENTS

JP 2005/252271 9/2005

OTHER PUBLICATIONS

Kozubal, "Innovation Incubator: LiquidCool Solutions Technical Evaluation Laboratory Study and Demonstration Results of a Directed-Flow, Liquid Submerged Server for High-Efficiency Data Centers" National Renewable Energy Laboratory, Dec. 2017, 59 pages.

(Continued)

*Primary Examiner* — Zachary Pape
(74) *Attorney, Agent, or Firm* — Fish & Richardson P.C.

(57) ABSTRACT

An apparatus includes a housing having a bottom surface and one or more mounting members that enable the housing to be mounted in a rack. The apparatus includes liquid cooling components mounted within the housing. The liquid cooling components include tubing within which a coolant may be communicated, and a heat exchange component that thermally couples a heat load within the housing to the coolant so that heat from the heat load is transferred to the coolant. The bottom surface of the housing defines a drain path. The heat exchange component is positioned in a downward direction of gravity relative to the heat load when the housing is mounted in the rack. In the event of a coolant leak, the coolant leak will occur beneath the heat load and the coolant will flow away from the heat load and exit the housing by use of the drain path.

17 Claims, 3 Drawing Sheets

(56) References Cited

U.S. PATENT DOCUMENTS

| | | |
|---|---|---|
| 2010/0103614 A1 | 4/2010 | Campbell et al. |
| 2011/0149517 A1 | 6/2011 | Uluc et al. |
| 2011/0313576 A1 | 12/2011 | Nicewonger |
| 2014/0251583 A1 | 9/2014 | Eriksen |
| 2015/0048950 A1 | 2/2015 | Zeighami et al. |
| 2016/0128238 A1 | 5/2016 | Shedd et al. |
| 2018/0042137 A1* | 2/2018 | Reeves ............... H01L 21/4878 |
| 2019/0098796 A1 | 3/2019 | Wakino et al. |
| 2019/0166724 A1 | 5/2019 | Moss et al. |

OTHER PUBLICATIONS

Wikipedia.com [online], "Server immersion cooling" Nov. 2019, [retrieved Nov. 2019] retrieved from: URL <https://en.wikipedia.org/wiki/Server_immersion_cooling>, 6 pages.

Extended European Search Report in European Application No. 20202418.8, dated Mar. 19, 2021, 14 pages.

\* cited by examiner

INVERTED LIQUID COOLING SYSTEM

TECHNICAL FIELD

This specification relates generally to providing cooling to electronic equipment.

BACKGROUND

Large computer, storage, or networking server systems, typically used in datacenters, generate heat through power consumption. Excessive heat generation by an electronic device without sufficient cooling can lead to damage and failure of the electronic device. Improved cooling can also result in higher performance of computer systems. Oftentimes liquid cooling systems are used to cool these systems.

The liquid cooling system is typically a closed loop system that communicates chilled cooling fluid (coolant) to a heat exchange component that is thermally coupled to a heat load (e.g., electronic device) that requires cooling. The liquid cooling system can include a cold plate or a coolant pool. The cold plate or the coolant pool transfers heat from the heat load to the coolant, and the heated coolant is communicated to a heat exchange for chilling.

When a liquid coolant leak occurs in the liquid cooling system, the leaked coolant can come into contact with the electronic device. The leaked coolant can cause damage to the electronic device.

SUMMARY

The technology in this patent application is related to systems and methods for inverted liquid cooling systems that can reduce the likelihood of damage to electronic devices caused by cooling system leakage.

Many techniques may be used to cool electronic devices (e.g., processors, memories, networking devices, and other heat generating devices) that are located on a server or network rack tray. For instance, liquid cooling systems can be used to remove heat from electronic devices using a liquid heat transfer medium.

A liquid cooling system transfers thermal energy from a higher temperature device to a lower temperature fluid medium. The fluid medium (coolant) is frequently water, but can also be refrigerants or other fluids. The cooling system frequently includes a cold plate or a coolant pool positioned on top of, or above, an electronic device with respect to the direction of gravity.

When liquid cooling system components are mounted on top of an electronic device, there may be many potential junctions where liquid coolant can leak onto the electronic device. Liquid coolant leakage contacting an electronic device can result in damage such as corrosion and electrical short circuits. Liquid coolant leakage can be slow leaks that are difficult to detect. Therefore, electrical devices may be damaged before the liquid coolant leakage is detected.

To reduce the likelihood of damage due to liquid coolant leaks, an inverted liquid cooling system can be incorporated into a housing. When the housing is mounted in a server rack, the liquid cooling components are positioned in a downward direction of gravity relative to the heat load. In the event of a coolant leak in the liquid cooling components, the coolant leak will occur beneath the heat load. Leaked coolant will flow away from the heat load toward a bottom surface of the housing. The leaked coolant can then exit the housing by use of a drain path.

Because the leaked coolant from an inverted liquid cooling system flows away from the heat load, the leaked coolant does not contact the heat load. Therefore, by employing an inverted liquid cooling system, the leaked coolant can be prevented from damaging the heat load. Additionally, when mounted in a server rack, the drain path can isolate leaked coolant originating from a first housing from a second housing.

In general, one innovative aspect of the subject matter described in this specification can be embodied in an apparatus that includes a first housing having a bottom surface and one or more mounting members attached to the first housing that enable the housing to be mounted in a rack. The apparatus includes liquid cooling components mounted within the first housing. The liquid cooling components include tubing within which a coolant may be communicated. The liquid cooling components include a heat exchange component coupled to the tubing and that thermally couples a heat load within the first housing to the coolant so that heat from the heat load is transferred to the coolant. The bottom surface of the first housing defines a drain path. The heat exchange component is positioned in a downward direction of gravity relative to the heat load when the first housing is mounted in the rack. In the event of a coolant leak in the liquid cooling components, the coolant leak will occur beneath the heat load and the coolant will flow away from the heat load and exit the first housing by use of the drain path.

The foregoing and other embodiments can each optionally include one or more of the following features, alone or in combination. In some implementations, the heat exchange component includes a cold plate that is coupled to the tubing and that provides cooling to the heat load.

In some implementations, the heat exchange component comprises a second housing located within the first housing. The second housing has a bottom portion positioned in a downward direction of gravity relative to the heat load, a top portion that is defined by the heat load and that is fluidly sealed from the heat load, and side portions extending from the bottom portion to the top portion. The top portion, bottom portion, and side portions enclose a void in which the coolant is communicated.

In some implementations, the heat load comprises a printed circuit board.

In some implementations, the coolant is water.

In general, one innovative aspect of the subject matter described in this specification can be embodied in system that includes a plurality of slots. The system includes a plurality of first housings, each first housing having a bottom surface and one or more mounting members attached to the first housing that enable the first housing to be mounted in a respective one of the plurality of slots. The system includes liquid cooling components mounted within each of the plurality of first housings. The liquid cooling components include tubing within which a coolant may be communicated, and a heat exchange component coupled to the tubing and that thermally couples a heat load within the first housing to the coolant so that heat from the heat load is transferred to the coolant. The bottom surface of each of the first housings defines a drain path. The heat exchange component in each first housing is positioned in a downward direction of gravity relative to the heat load when the first housing is mounted in the respective one of the plurality of slots. In the event of a coolant leak in the liquid cooling components, the coolant leak will occur beneath the heat load and the coolant will flow away from the heat load and exit the first housing by use of the drain path.

The foregoing and other embodiments can each optionally include one or more of the following features, alone or in combination. In some implementations, the heat exchange component includes a cold plate that is coupled to the tubing and that provides cooling to the heat load.

In some implementations, the heat exchange component comprises a second housing located within each first housing. The second housing has a bottom portion positioned in a downward direction of gravity relative to the heat load, a top portion that is defined by the heat load and that is fluidly sealed from the heat load, and side portions extending from the bottom portion to the top portion. The top portion, bottom portion, and side portions enclose a void in which the coolant is communicated.

In some implementations, the heat load comprises a printed circuit board.

In some implementations, the coolant is water.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
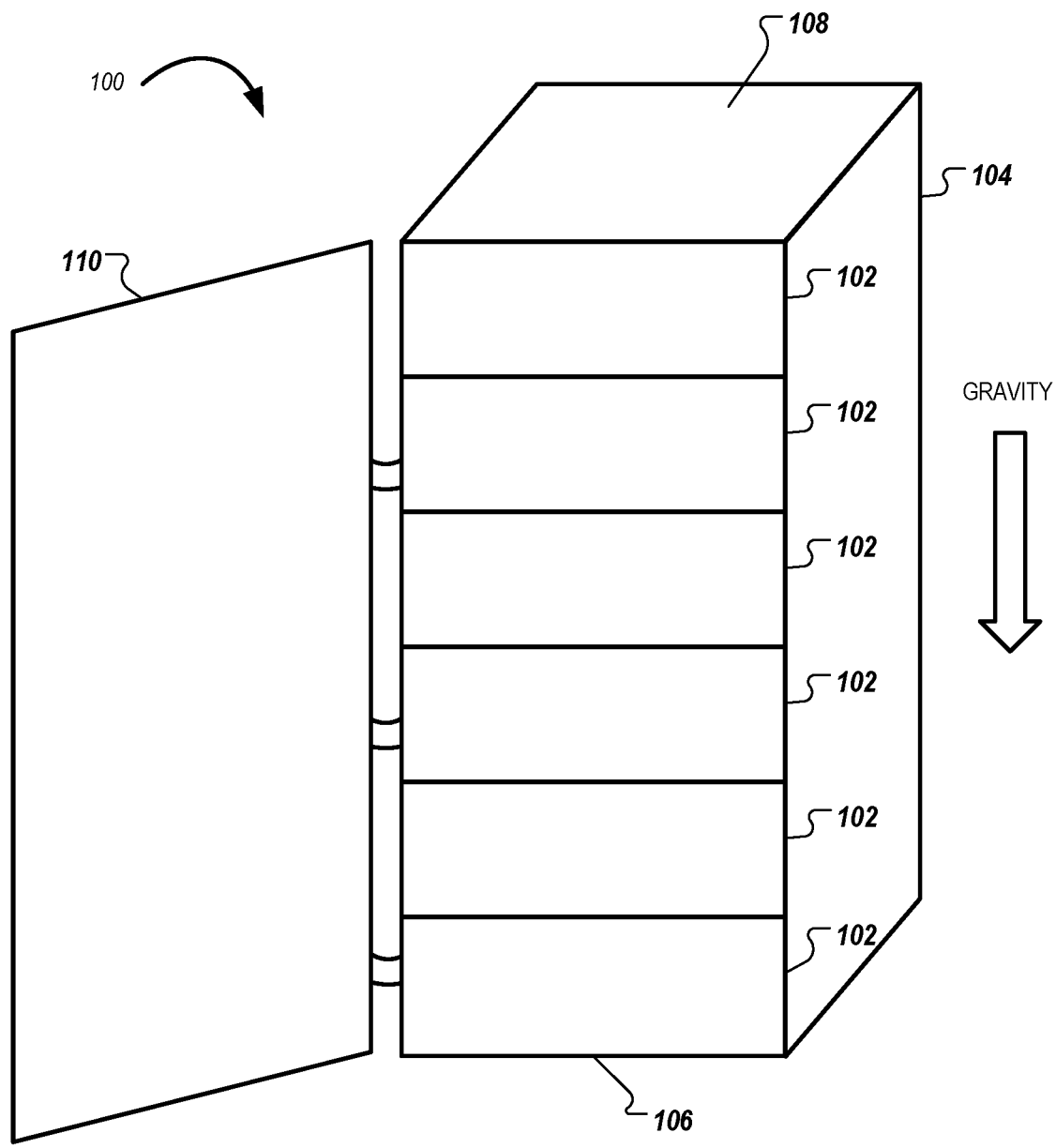
FIG. 1 illustrates an example system for supporting multiple apparatuses that employ inverted liquid cooling systems.

FIG. 1 illustrates an example system for supporting multiple apparatuses that employ inverted liquid cooling systems. The system can be, for example, a rack 100. The apparatuses can be, for example, server trays that employ inverted liquid cooling systems.

The rack 100 includes a frame 104 having multiple slots 102. The rack 100 can include a bottom surface 106 and a top surface 108. The rack 100 is positioned such that the bottom surface 106 of the rack 100 is in a downward direction of gravity relative to a top surface 108 of the rack 100. The rack 100 may include a front panel 110.

The rack 100 may include any appropriate number of slots 102. For example, the rack 100 can include six slots 102, ten slots 102, twenty slots 102, etc. The slots 102 may be vertically stacked with respect to the direction of gravity. Each slot 102 can support an apparatus, for example, a server tray. Each slot 102 can support an apparatus using supporting equipment. Supporting equipment can be, for example, rails, slides, or brackets mounted within each slot 102.

Figure 2A:
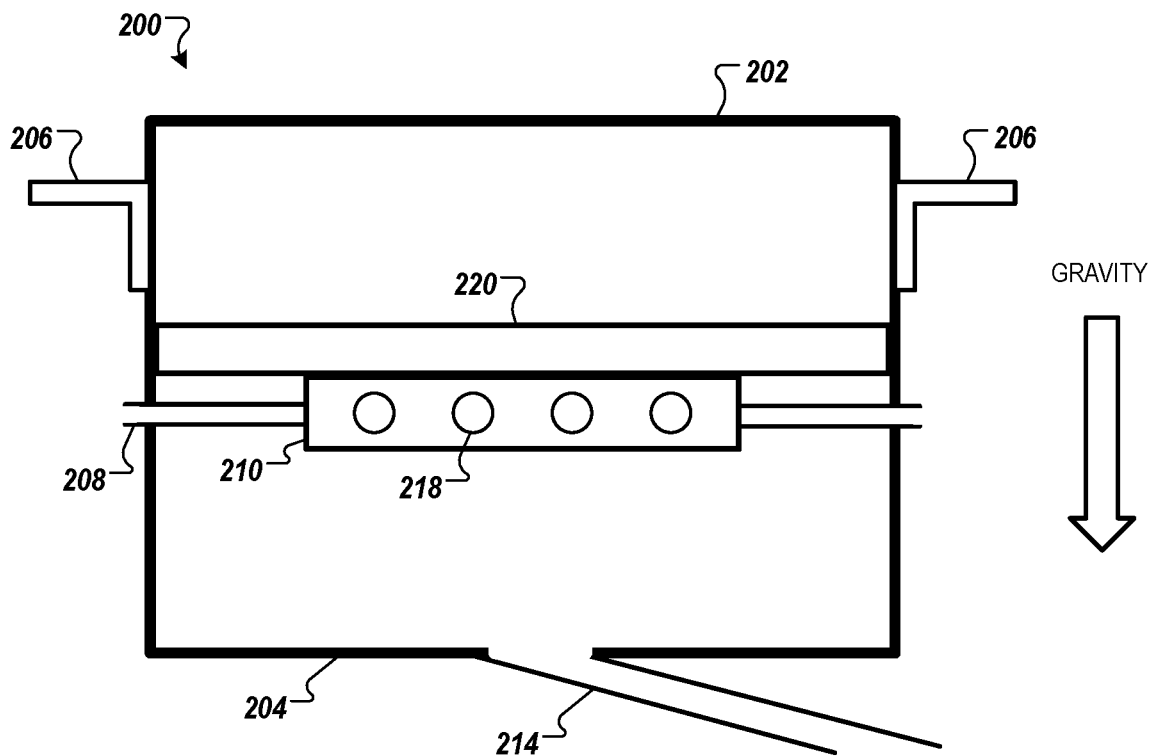
FIGS. 2A and 2B illustrate cross-sectional views of an example apparatus employing an inverted cold plate liquid cooling system, with and without coolant flow.
Figure 2B:
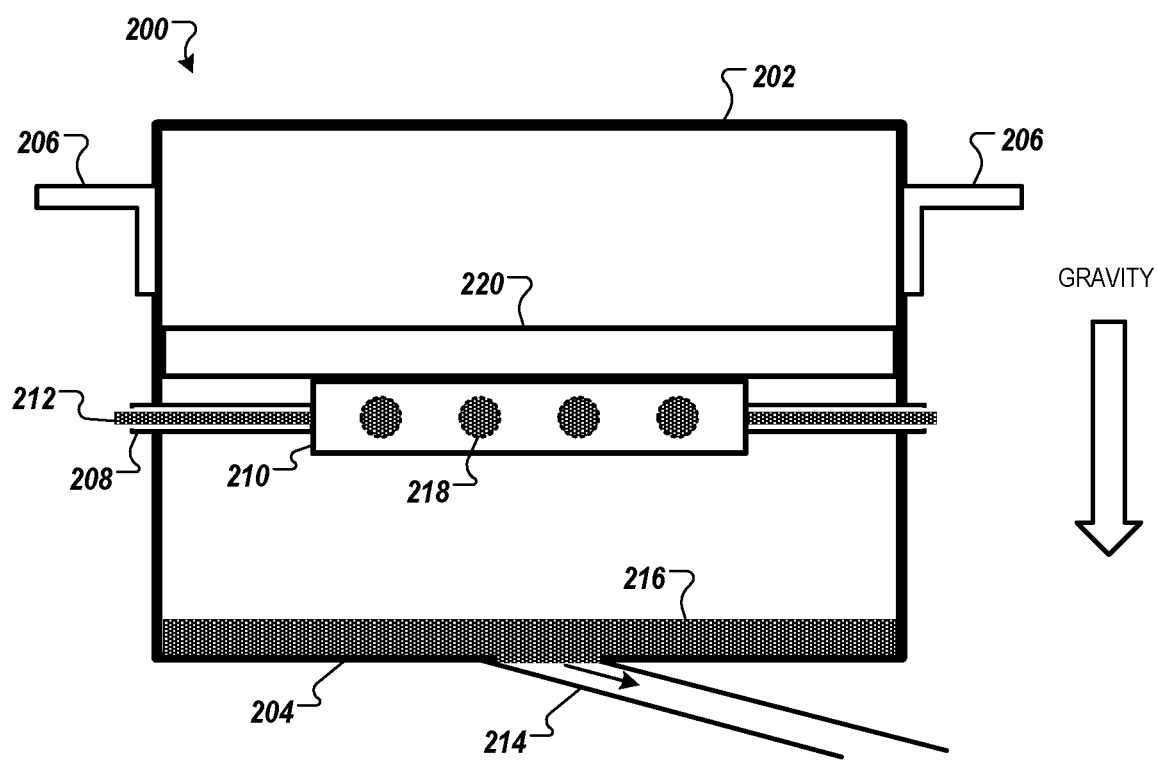

FIGS. 2A and 2B illustrate cross-sectional views of an example apparatus 200 employing an inverted cold plate liquid cooling system, with and without coolant flow. The apparatus 200 may be inserted into a slot 102 of the rack 100.

With reference to FIG. 2A, the apparatus 200 includes a first housing 202 having a bottom surface 204 defining a drain path 214. The drain path 214 can be, for example, a channel or surface that can collect fluid. The drain path 214 can corral or guide the fluid in the downward direction of gravity relative to other components of the apparatus 200. In some examples, the drain path 214 can guide the fluid to a centralized collection for leaked fluid. The centralized collection for leaked fluid can be used for leakage detection.

The apparatus 200 can include one or more mounting members 206 attached to the first housing 202. The mounting members 206 can enable the first housing 202 to be mounted in a rack. For example, the first housing 202 can be mounted in a slot 102 of the rack 100. The mounting members 206 can be, for example, rails, slides, or brackets that can couple to supporting equipment of the rack 100.

The apparatus 200 can include liquid cooling components mounted within the first housing 202. The liquid cooling components can include tubing 208 and a heat exchange component coupled to the tubing 208. The heat exchange component can be, for example, a cold plate 210.

The cold plate 210 can be constructed from a metal or other material that can transfer heat from one medium to another. The cold plate 210 includes cold plate tubing 218. For example, metal of the cold plate can enclose the cold plate tubing 218. The cold plate tubing can be various shapes and sizes that enable the cold plate 210 to efficiently transfer heat.

With reference to FIG. 2B, in operation, coolant 212 communicates, or flows, through the tubing 208 and the cold plate tubing 218. The cold plate 210 thermally couples a heat load 220 within the first housing 202 to the coolant 212 so that heat from the heat load 220 is transferred to the coolant 212. In many examples, the coolant 212 is water. In some examples, the coolant 212 may be a refrigerant or other fluid.

The heat load 220 can be, for example, one or more electronic devices, e.g., components of a computer server. In some examples, the heat load 220 may be a printed circuit board that includes electronic components that, when powered, generate heat. In some examples, the heat load 220 may be a mounting structure upon which one more circuit boards, or other electronic components, may be mounted and powered.

When the first housing 202 is mounted in the rack 100, the liquid cooling components, including the cold plate 210 and the tubing 208, are positioned in a downward direction of gravity relative to the heat load 220. Thus, in the event of a coolant leak in the liquid cooling components, the coolant leak will occur beneath the heat load 220. Leaked coolant 216 will flow away from the heat load 220 toward the bottom surface 204. The leaked coolant 216 can exit the first housing 202 by use of the drain path 214.

Because the leaked coolant 216 flows away from the heat load 220, the leaked coolant 216 does not contact the heat load 220, or at least leaked coolant contact with the head load is reduced relative to the contact that would occur if the cold plate 210 were atop the heat load. Therefore, by employing an inverted liquid cooling system, the leaked coolant 216 can be prevented from damaging the heat load 220, or the likelihood of damage may be reduced.

When mounted in a rack, e.g., the rack 100, the drain path 214 isolates the leaked coolant 216 originating from the first housing from other components in the rack 100. For example, the first housing of the apparatus 200 may be mounted in a slot 102 vertically above another apparatus 200 with respect to a direction of gravity. A coolant leak may occur in the uppermost apparatus 200. The leaked coolant 216 exits the first housing of the apparatus 200 by use of the drain path 214. The drain path 214 of the first housing isolates the leaked coolant from the components below.

Therefore, the leaked coolant 216 can be prevented from damaging the heat load 220 within the first housing, and other components in the rack 100.

Figure 3A:
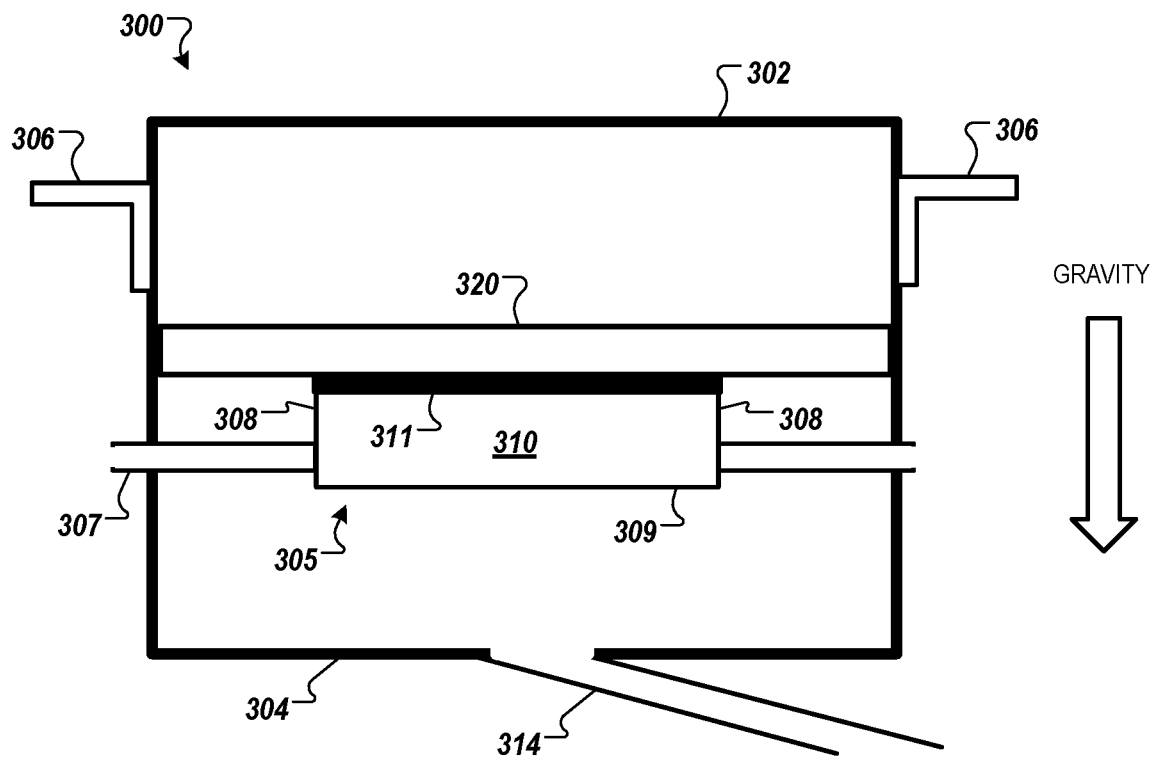
FIGS. 3A and 3B illustrate cross-sectional views of an example apparatus employing an inverted pooled liquid cooling system, with and without coolant flow.
Figure 3B:
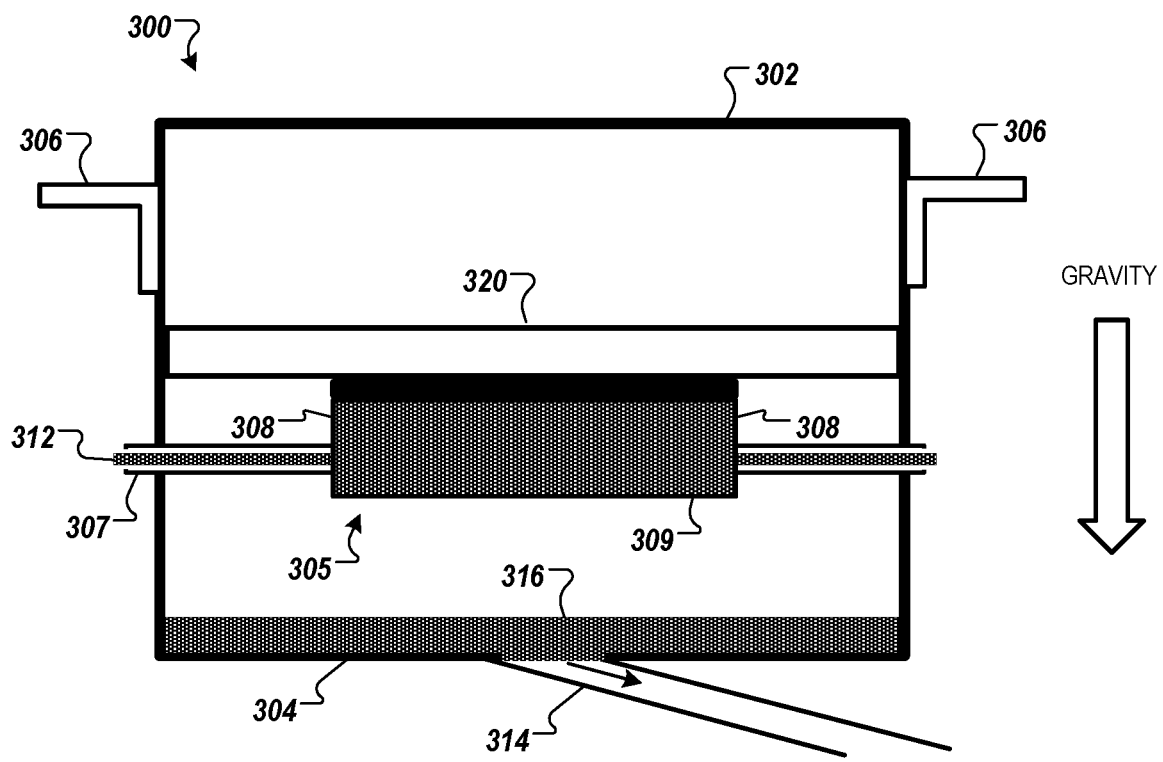

FIGS. 3A and 3B illustrate cross-sectional views of an example apparatus 300 employing an inverted pooled liquid cooling system, with and without coolant flow.

With reference to FIG. 3A, the apparatus 300 includes a first housing 302 having a bottom surface 304 defining a drain path 314. The drain path 314 can be, for example, a channel or surface that can collect fluid and guide the fluid in the downward direction of gravity relative to other components. In some examples, the drain path 214 can guide the fluid to a centralized collection for leaked fluid. The centralized collection for leaked fluid can be used for leakage detection.

The apparatus 300 can include one or more mounting members 306 attached to the first housing 302. The mounting members 306 can enable the first housing 302 to be mounted in a rack, e.g., the rack 100. The mounting members 306 can be, for example, rails, slides, or brackets that can couple to supporting equipment of the rack 100.

The apparatus 300 can include liquid cooling components mounted within the first housing 302. The liquid cooling components can include tubing 307 and a heat exchange component coupled to the tubing 307. The heat exchange component can be, for example, a coolant pool housing 305 that is filled with coolant, and which is referred to more generally as a second housing.

The coolant pool housing 305 is a second housing located within the first housing 302. The coolant pool housing 305 can be constructed from a metal or other material that can contain coolant with avoid 310 formed within the coolant pool housing 305. The coolant pool housing 305 includes a bottom portion 309 positioned in a downward direction of gravity relative to the heat load 320. The coolant pool housing 305 includes a top portion 311 that is defined by the heat load 320. The top portion 311 of the coolant pool housing 305 is fluidly sealed from the heat load 320, e.g., by an epoxy layer that is impervious to the coolant. The coolant pool housing 305 includes side portions 308 extending from the bottom portion 309 to the top portion 311. The top portion 311, bottom portion 309, and side portions 308 enclose the void 310.

With reference to FIG. 3B, in operation, coolant 312 communicates, or flows, through the tubing 307 and the void 310 of the coolant pool housing 305. The coolant 312 may partially or entirely fill the void 310. The fluidly sealed top portion 311 prevents coolant 312 from contacting the heat load 320.

The coolant pool housing 305 thermally couples the heat load 320 within the first housing 302 to the coolant 312 so that heat from the heat load 320 is transferred to the coolant 312. In many examples, the coolant 312 is water. In some examples, the coolant 212 may be a refrigerant or other fluid.

The heat load 320 can be, for example, one or more electronic devices, e.g., components of a computer server. In some examples, the heat load 320 may be a printed circuit board that includes electronic components that, when powered, generate heat. In some examples, the heat load 320 may be a mounting structure upon which one more circuit boards, or other electronic components, may be mounted and powered.

When the first housing 302 is mounted in a slot 102 of the rack 100, the liquid cooling components, including the coolant pool housing 305 and the tubing 307, are positioned in a downward direction of gravity relative to the heat load 320. Thus, in the event of a coolant leak in the liquid cooling components, the coolant leak will occur beneath the heat load 320, including portions of the heat load that may not be protected from the coolant (e.g., a top side of the heat load 320. Leaked coolant 316 will flow away from the heat load 320 toward the bottom surface 304. The leaked coolant 316 can exit the first housing 302 by use of the drain path 314.

Because the leaked coolant 316 flows away from the heat load 320, the leaked coolant 316 does not contact the unprotected portions of heat load 320. Therefore, by employing an inverted liquid cooling system, the leaked coolant 316 can be prevented from damaging the heat load 320, or damage many be minimized relative to damage that could occur if the coolant pool housing 305 were located above the heat load 32.

When mounted in a rack, e.g., the rack 100, the drain path 314 isolates the leaked coolant 316 originating from the second housing from other components in the rack 100. For example, the first housing may be mounted in a slot 102 vertically above the second housing with respect to a direction of gravity. A coolant leak may occur in the first housing 302. The leaked coolant 316 exits the first housing by use of the drain path 314. The drain path 314 of the first housing isolates the leaked coolant from the other components in the rack 100. Therefore, the leaked coolant 316 can be prevented from damaging the heat load 320 within the first housing 302 and other components in the rack 100.

Although described in this specification the context of a housing, it should be understood that the features described can also be realized by the mounting of a printed circuit board having a first side and a second side. When mounted, the second side is in the downward direction of gravity from the first side. The liquid cooling components can be positioned underneath the printed circuit board and coupled to the second side of printed circuit board. A drain path can be positioned beneath the printed circuit board.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus, comprising:
a first housing having a bottom surface and one or more mounting members attached to the first housing that enable the housing to be mounted in a rack;
liquid cooling components mounted within the first housing, the liquid cooling components including:
tubing within which a coolant may be communicated; and
a heat exchange component coupled to the tubing and that thermally couples a heat load within the first housing to the coolant so that heat from the heat load is transferred to the coolant;
wherein:
the bottom surface of the first housing defines a drain path; and
the heat exchange component is positioned in a downward direction of gravity relative to the heat load when the first housing is mounted in the rack so that in the event of a coolant leak in the liquid cooling components, the coolant leak will occur beneath the heat load and the coolant will flow away from the heat load and exit the first housing by use of the drain path.

2. The apparatus of claim 1, wherein the heat exchange component comprises:
a cold plate that is coupled to the tubing and that provides cooling to the heat load.

3. The apparatus of claim 1, wherein the heat exchange component comprises a second housing located within the first housing, the second housing having a bottom portion positioned in a downward direction of gravity relative to the heat load, a top portion that is defined by the heat load and that is fluidly sealed from the heat load, and side portions extending from the bottom portion to the top portion, and wherein the top portion, bottom portion, and side portions enclose a void in which the coolant is communicated.

4. The apparatus of claim 1, wherein the heat load comprises a printed circuit board.

5. The apparatus of claim 1, wherein the coolant is water.

6. A system, comprising:
a plurality of slots;
a plurality of first housings, each first housing having a bottom surface and one or more mounting members attached to the first housing that enable the first housing to be mounted in a respective one of the plurality of slots;
liquid cooling components mounted within each of the plurality of first housings, the liquid cooling components including:
tubing within which a coolant may be communicated; and
a heat exchange component coupled to the tubing and that thermally couples a heat load within the first housing to the coolant so that heat from the heat load is transferred to the coolant;
wherein:
the bottom surface of each of the first housings defines a drain path; and
the heat exchange component in each first housing is positioned in a downward direction of gravity relative to the heat load when the first housing is mounted in the respective one of the plurality of slots so that in the event of a coolant leak in the liquid cooling components, the coolant leak will occur beneath the heat load and the coolant will flow away from the heat load and exit the first housing by use of the drain path.

7. The system of claim 6, wherein the one or more slots are vertically stacked.

8. The system of claim 6, wherein in the event of a coolant leak in the liquid cooling components mounted within a first housing, the drain path isolates the coolant leak from other components that are positioned in one of the plurality of slots and in a downward direction of gravity relative to the first housing.

9. The system of claim 6, wherein the heat exchange component comprises:
a cold plate that is coupled to the tubing and that provides cooling to the heat load.

10. The system of claim 6, wherein the heat exchange component comprises a second housing located within each first housing, the second housing having a bottom portion positioned in a downward direction of gravity relative to the heat load, a top portion that is defined by the heat load and that is fluidly sealed from the heat load, and side portions extending from the bottom portion to the top portion, and wherein the top portion, bottom portion, and side portions enclose a void in which the coolant is communicated.

11. The system of claim 6, wherein the heat load comprises a printed circuit board.

12. The system of claim 6, wherein the coolant is water.

13. A system, comprising:
a plurality of slots;
a plurality of printed circuit boards, each of which when powered generates a respective heat load, and each having a first side and a second side, wherein the printed circuit board is mounted in the slot such that the second side is in the downward direction of gravity from the first side;
for each of the printed circuit boards:
liquid cooling components coupled to the second side of the printed circuit board, the liquid cooling components including:
tubing within which a coolant may be communicated; and
a heat exchange component coupled to the tubing and coupled to the second side of the printed circuit board, thereby coupling the heat load to the coolant so that heat from the heat load is transferred to the coolant;
wherein:
the heat exchange component is positioned in a downward direction of gravity relative to the heat load so that in the event of a coolant leak in the liquid cooling components, the coolant leak will occur beneath the heat load and the coolant will flow away from the heat load; and
a surface beneath the liquid cooling components of the printed circuit board and defining a drain path so that in the event of a coolant leak, the coolant will flow away from the heat load and exit the system by use of the drain path.

14. The system of claim 13, wherein the one or more slots are vertically stacked.

15. The system of claim 13, wherein in the event of a coolant leak in the liquid cooling components, the drain path isolates the coolant leak from other components that are positioned in one of the plurality of slots and in a downward direction of gravity relative to the first housing.

16. The system of claim 13, wherein the heat exchange component comprises:
   a cold plate that is coupled to the tubing and that provides cooling to the heat load.

17. The system of claim 13, wherein the coolant is water.

* * * * *